(12) United States Patent
Park et al.

(10) Patent No.: US 9,628,734 B2
(45) Date of Patent: Apr. 18, 2017

(54) STACKED IMAGE SENSOR

(71) Applicant: Samsung Electronics Co., Ltd., Suwon-si, Gyeonggi-do (KR)

(72) Inventors: Kyung Bae Park, Hwaseong-si (KR); Gae Hwang Lee, Seongnam-si (KR); Kwang Hee Lee, Yongin-si (KR); Yong Wan Jin, Seoul (KR); Chul Joon Heo, Busan (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/660,383

(22) Filed: Mar. 17, 2015

(65) Prior Publication Data
US 2016/0065913 A1    Mar. 3, 2016

(30) Foreign Application Priority Data
Aug. 27, 2014    (KR) .................. 10-2014-0112424

(51) Int. Cl.
*H04N 5/374*    (2011.01)
*H01L 27/146*    (2006.01)
*H04N 9/04*    (2006.01)

(52) U.S. Cl.
CPC ....... *H04N 5/374* (2013.01); *H01L 27/14621* (2013.01); *H01L 27/14636* (2013.01); *H01L 27/14647* (2013.01); *H01L 27/14627* (2013.01); *H04N 9/045* (2013.01)

(58) Field of Classification Search
None
See application file for complete search history.

(56) References Cited

U.S. PATENT DOCUMENTS

| 8,368,784 | B2 | 2/2013 | Yamaguchi | |
| 2003/0209651 | A1* | 11/2003 | Iwasaki | H01L 27/302 250/214.1 |
| 2006/0125944 | A1* | 6/2006 | Inuiya | H01L 27/14621 348/311 |

(Continued)

FOREIGN PATENT DOCUMENTS

| JP | 2006140249 A | 6/2006 |
| JP | 2011029337 A | 2/2011 |

(Continued)

*Primary Examiner* — Dennis Hogue
(74) *Attorney, Agent, or Firm* — Harness, Dickey & Pierce, PLC

(57) ABSTRACT

A stacked image sensor includes a substrate including a first photoelectric conversion device, a second photoelectric conversion device and a first color signal storing device disposed between the first photoelectric conversion device and the second photoelectric conversion device. A second color filter and a third color filter are disposed at positions corresponding to the first photoelectric conversion device and the second photoelectric conversion device on the substrate. A conductive connecting member is disposed between the second color filter and the third color filter. A first color sensing photoelectric conversion device is disposed on the second color filter, the third color filter, and the conductive connecting member. The cross-sectional area of conductive connecting member is at least greater than the cross-sectional area of the first color signal storing device.

8 Claims, 3 Drawing Sheets

(56) References Cited

U.S. PATENT DOCUMENTS

| | | | |
|---|---|---|---|
| 2007/0205477 A1* | 9/2007 | Yokoyama | H01L 27/14647 257/429 |
| 2007/0279501 A1* | 12/2007 | Goto | H01L 27/14647 348/272 |
| 2008/0225142 A1* | 9/2008 | Goto | H01L 27/14621 348/272 |
| 2011/0228151 A1* | 9/2011 | Inomata | H01L 27/14618 348/294 |
| 2011/0272772 A1* | 11/2011 | Kokubun | H01L 27/14632 257/432 |
| 2013/0033628 A1 | 2/2013 | Yamaguchi | |
| 2014/0001454 A1 | 1/2014 | Miyanami et al. | |
| 2014/0077324 A1* | 3/2014 | Matsugai | H01L 27/14618 257/432 |

FOREIGN PATENT DOCUMENTS

| | | |
|---|---|---|
| JP | 4700947 B2 | 6/2011 |
| JP | 2014078673 A | 5/2014 |

* cited by examiner

STACKED IMAGE SENSOR

CROSS-REFERENCE TO RELATED APPLICATIONS

This application claims priority to and the benefit of Korean Patent Application No. 10-2014-0112424 filed in the Korean Intellectual Property Office on Aug. 27, 2014, the entire contents of which are incorporated herein by reference.

BACKGROUND

The present disclosure relates to a stacked image sensor. A digital camera and a camcorder include an image sensor storing an electrical signal for an image, and the image sensor separates incident light into three primary colors of red, green, and blue and converts them into respective electrical signals.

The image sensor filters one color out of three primary colors of light, and senses it through photoelectric conversion by using a photodiode responsive to one of the three primary colors.

In conventional image sensors, green light is sensed by photoelectric conversion of green light by using a green light sensing organic photoelectric conversion device, and red light and blue light are sensed by combining a red color filter and a blue color filter with photoelectric conversion devices.

SUMMARY

However, a signal obtained by this green light-sensing organic photoelectric conversion device sensing the green light may be distorted by influence of the blue and red lights. When the green light signal is distorted by the blue light or the red light, an image may become greenish overall. Accordingly, a structure capable of preventing the above distortion is required.

According to an example embodiment, a stacked image sensor may include a substrate including a first photoelectric conversion device, second photoelectric conversion device, and a signal storing device configured to store a signal corresponding to a first color ("first color signal storing device"). The first color signal storing device is interposed between the first photoelectric conversion device and the second photoelectric conversion device. A first filter configured to filter a second color ("second color filter") and a second filter configured to filter a third color ("third color filter") are disposed at positions corresponding to the first photoelectric conversion device and the second photoelectric conversion device on the substrate. A conductive connecting member is disposed between the second color filter and the third color filter. A color sensing photoelectric conversion device configured to sense the first color ("first color sensing photoelectric conversion device") is disposed on the second color filter, the third color filter, and the conductive connecting member, wherein an area of the conductive connecting member is greater than or equal to the area of the first color signal storing device. The conductive connecting member of such configuration reduces or minimizes a signal distortion due to the influence of the blue lights or the red lights.

The stacked image sensor may further include a plug connecting the conductive connecting member with the first color signal storing device.

The first color sensing photoelectric conversion device may include a first electrode contacting the conductive connecting member, a semiconductor layer disposed on the first electrode, and a second electrode disposed on the semiconductor layer.

The first color may be green, the second color may be blue, and the third color may be red.

The stacked image sensor may further include an insulation layer between the second color filter and the first electrode, and between the third color filter and the first electrode, and the insulation layer may include at least one of a silicon oxide ($SiO_x$), a silicon nitride ($SiN_x$), an aluminum oxide ($AlO_x$), and a germanium oxide ($GeO_x$).

The stacked image sensor may further include a plurality of micro lenses disposed on the first color sensing photoelectric conversion device, and the conductive connecting member may shade the entire cross-sectional area of the first color signal storing device when viewed from the top side of the micro lens.

The first photoelectric conversion device and the second photoelectric conversion device may include a CMOS device, and the conductive connecting member may include at least one of aluminum (Al), tungsten (W), chromium (Cr), molybdenum (Mo), copper (Cu), gold (Ag), and gadolinium (Gd).

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
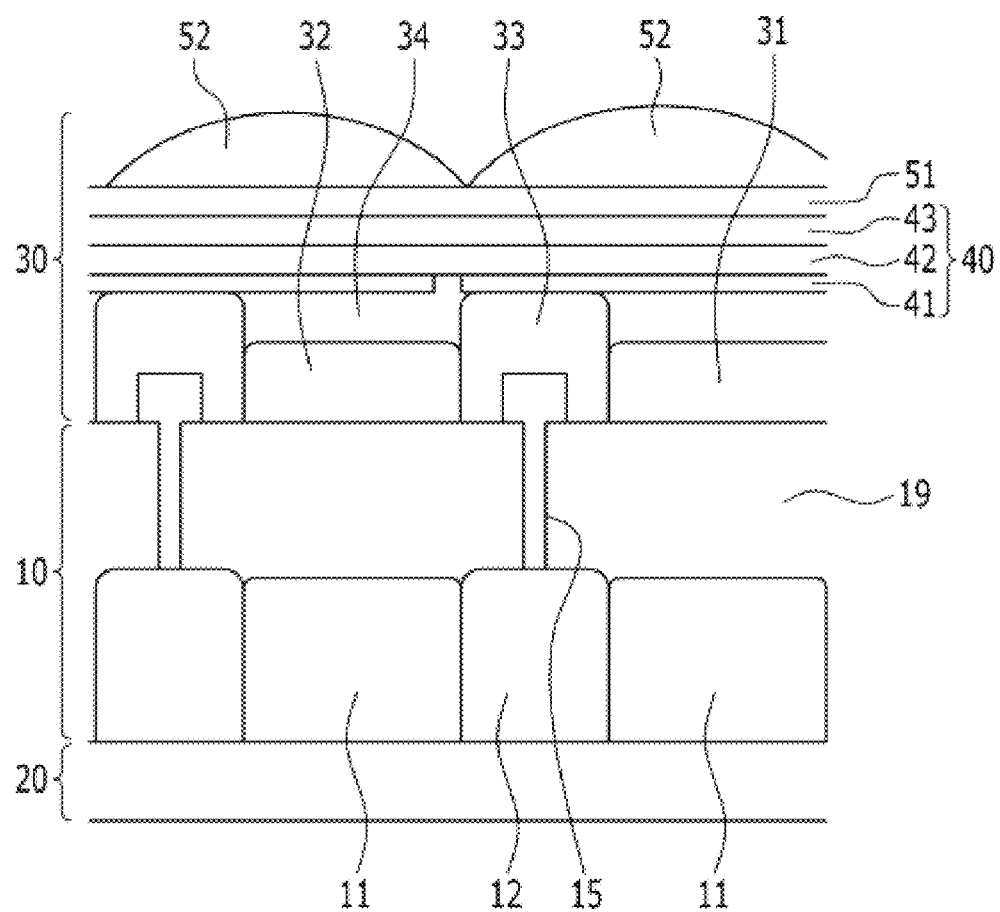
FIG. 1 is a cross-sectional view showing an image sensor according to an example embodiment.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). It will be understood that when an element such as a layer, film, region, or substrate is referred to as being disposed "on" another element, it can be directly on the other element or intervening elements may also be present. As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a sensor or filter device/region illustrated as a rectangle may have rounded or curved features. Thus, the device/regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Unless otherwise defined, a first color signal storing device refers to a device configured to store a first color signal, second color filter refers to a filter configured to filter a second color, a third color filter refers to a filter configured to filter a third color. These terms are only used to distinguish one filter element, component, region, layer or section from another filter element, component, region, layer or section.

Figure 2:
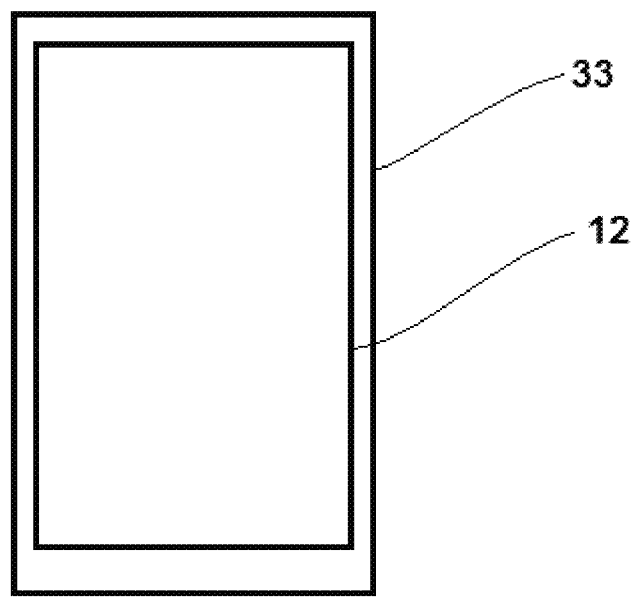
FIG. 2 is a layout view showing the conductive connecting member and the green color signal storing device.

FIG. 1 is a cross-sectional view showing an image sensor according to an example embodiment. FIG. 2 is a layout view showing the conductive connecting member and the green color signal storing device.

The image sensor of FIG. 1 includes a substrate portion 10, a stacking portion 30 disposed on the substrate portion 10, and a transmitting circuit portion 20 disposed under the substrate portion 10.

The substrate portion 10 includes a silicon substrate 19, and a photoelectric conversion device 11 and a green storing device 12 under the silicon substrate 19. The substrate portion 10 includes a plug 15 that is formed through the silicon substrate 19 and connects the green storing device 12 with a conductive connecting member 33 of the stacking portion 30. The photoelectric conversion device 11 receives light and photo-electrically converts it into an electrical signal. The photoelectric conversion device 11 may be a CMOS (complementary metal-oxide semiconductor) device. The photoelectric conversion device 11 is connected to a wire of the transmitting circuit portion 20 through a switch (not shown). The green storing device 12 is a device configured to temporarily store charges that a green light-sensing organic photoelectric conversion device 40 produces by absorbing green light from an incident light.

The stacking portion 30 includes a red color filter 31 and a blue color filter 32, the conductive connecting member 33 contacting the plug 15, the green light-sensing organic photoelectric conversion device 40 disposed on the color filters 31 and 32 and the conductive connecting member 33, a protective layer 51 covering the green light-sensing organic photoelectric conversion device 40, and a lens layer 52 disposed on the protective layer 51. An insulating material 34 is disposed between the color filters 31 and 32 and the green light-sensing organic photoelectric conversion device 40. The insulating material layer 34 may be formed of an oxide or nitride such as a silicon oxide ($SiO_x$), a silicon nitride ($SiN_x$), an aluminum oxide ($AlO_x$), or a germanium oxide ($GeO_x$). The color filters 31 and 32 are disposed at positions corresponding to the photoelectric conversion devices 11, and light transmitting through the color filters 31 and 32 enters the photoelectric conversion device 11. The green light-sensing organic photoelectric conversion device 40 includes a first electrode 41, a second electrode 43, and an organic semiconductor layer 42 interposed between the electrodes 41 and 43. The organic semiconductor layer 42 includes a material such as Fullerene (C60). Other materials showing selective photoelectric conversion of green light may also be used. The first electrode 41 is separated for each color region, and electrically contacts the conductive connecting member 33. The second electrode 43 is integrally formed through the sensor. The first electrode 41 and the second electrode 43 may consist of a transparent conductive material of (Indium Tin Oxide (ITO) or Indium Zinc Oxide (IZO) and the like. The conductive connecting member 33 electrically connects the first electrode 41 of the green light-sensing organic photoelectric conversion device 40 and the plug 15, and also acts as a light blocking member. The conductive connecting member 33 transfers photoelectric charges and/or signal generated by the green light-sensing organic photoelectric conversion device 40 to the green storing device 12 through the plug 15 which is connected to the storing device 12. At the green storing device 12, the photoelectric charges are stored temporarily. The signal corresponding to the stored charges is transmitted by the transmitting circuit 20 for further processing. The conductive connecting member 33 may include or consist of an opaque metal, for example aluminum (Al), tungsten (W), chromium (Cr), molybdenum (Mo), copper (Cu), gold (Ag), gadolinium (Gd), and the like. The lens layer 52 may include a plurality of convex lenses disposed at each position corresponding to the color filters 31 and 32.

In example embodiments, if the width of the conductive connecting member 33 is regarded as x and the width of the green storing device 12 is regarded as y, a relationship of y≤x is satisfied. In other words, the width of the conductive connecting member 33 is greater than or equal to the width of the green storing device 12. Herein, the width includes the width of a side as well as the width of a front side in the drawing. Accordingly, as illustrated in FIG. 2, when the image sensor is viewed from the top (viewed from the micro convex lens), the conductive connecting member 33 covers all of the green storing device 12. In other words, an area of the conductive connecting member 33 is greater than or equal to an area of the green storing device 12.

In example embodiments, the projected area of the conductive connecting member 33 onto the green storing device 12 is at least greater than the area of the green storing device 12.

The conductive connecting member 33 being an opaque material most of the incident light on its surface is either reflected or absorbed. In this way, the conductive connecting member 33 substantially limits the light travelling toward the green storing device 12. A limited amount of light having a slope within a desired (or alternatively, predetermined) narrow range among red and green lights passing through the red color filter 31 and the blue color filter 32 may still reach the green storing device 12. Accordingly, from this configuration, the green light signals stored in the green storing device 12 may have little or no influence from the charges generated by spurious lights passing through the filters and the color sensing photoelectric conversion device. When the width of the conductive connecting member 33 is sufficiently larger than the width of the green storing device 12, the amount of light that reaches to the green storing device 12 will be very limited.

In example embodiments, when the cross-sectional area of the conducting connecting member is sufficiently larger than the cross-sectional area of the green storing device 12, almost no light will reach to the green storing device 12. The influence of the light impinging on the surface of the green storing device 12 passing through the color filters 31, 32, and color sensing photoelectric conversion device 40, will be substantially reduced.

A transmitting circuit portion 20 includes a transmitting circuit wire (not shown). The transmitting circuit wire is connected to the photoelectric conversion device 11 and the green storing device 12 through a switch or similar configurations. The transmitting circuit 20 transmits an electrical signal of light that the photoelectric conversion device 11 and the green light-sensing organic photoelectric conversion device 40 convert by receiving light, to a memory (not shown) or a data processor (not shown). The transmitting circuit 20 may be formed by attaching a separate substrate to the substrate portion 10, or laminating a wire layer and an insulation layer beneath the substrate portion 10.

In an example embodiment of the image sensor, light passing through the green light-sensing organic photoelectric conversion device 40 leaves red and blue lights through the color filters 31 and 32. The blue color filter 32 allows the blue light pass through it, and the red color filter 31 allows the red light pass through it. The red and blue lights enter the photoelectric conversion devices 11 positioned right beneath the color filters 31 and 32 and are respectively converted into red and blue photoelectric signals.

In example embodiments of FIG. 1, the green light-sensing organic photoelectric conversion device 40 and the red and blue color filters 31 and 32 are used, but other combinations are possible.

In example embodiments, a red light-sensing organic photoelectric conversion device and green and blue color filters, and a red storing device may be used.

In example embodiments, a blue light-sensing organic photoelectric conversion device and red and green color filters, and a blue storing device may be used.

Figure 3:
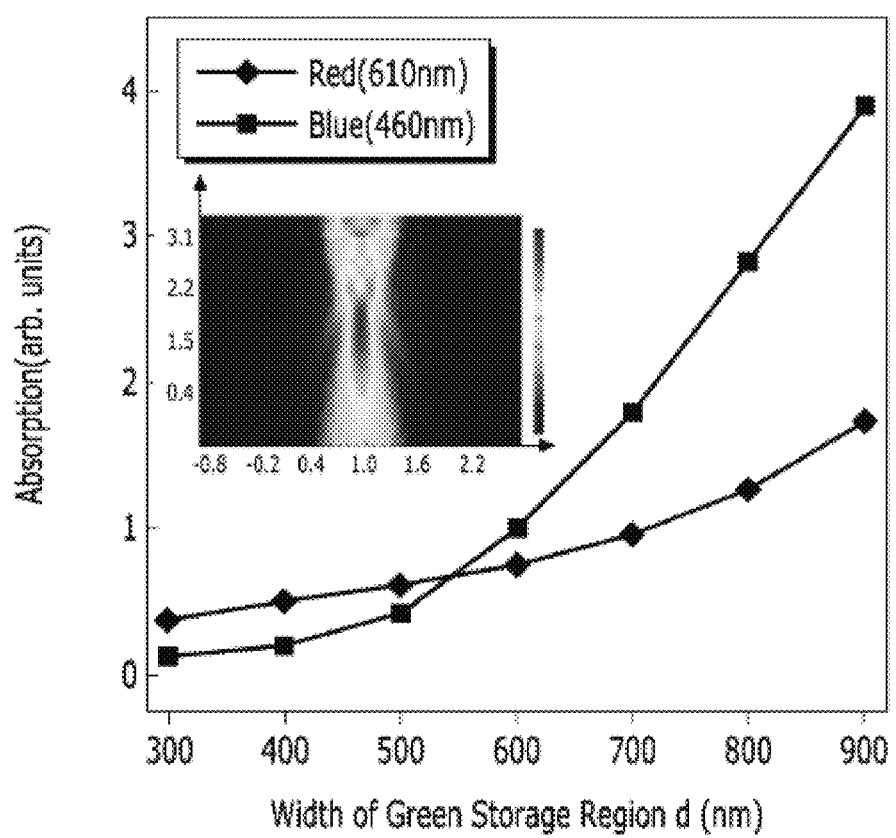
FIG. 3 is a graph showing absorption rates of red and blue lights depending on the width of a green storing device.

FIG. 3 is a graph showing absorption rates of the red and blue lights depending on the width of the green storing device.

FIG. 3 is obtained by performing a FDTD (finite difference time domain) simulation by changing the width of the green storing device 12, while the width of a conductive connecting member is fixed at about 5 μm in an image sensor having a pixel size (corresponding to the width of a color filter) of about 1.4 μm.

Referring to FIG. 3, the absorption rates of the red and blue lights increases as the width of the green storing device increases, and in particular, the absorption rate of the blue light sharply increases when the width of the green storing device is greater than or equal to about 500 nm. Accordingly, the width of the green storing device is smaller than or equal to the width of the conductive connecting member 33.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A stacked image sensor, comprising:
   a substrate including a first photoelectric conversion device, a second photoelectric conversion device, and a first color signal storing device, the first color signal storing device between the first photoelectric conversion device and the second photoelectric conversion device, the first color signal storing device configured to store an electrical charge associated with a first light;
   a first color filter corresponding to the first photoelectric conversion device, the first color filter configured to filter incident light into a second light, and a second color filter corresponding to the second photoelectric conversion device, the second color filter configured to filter incident light into a third light;
   a conductive connecting member interposed between the first color filter and the second color filter, the conductive connecting member having an area at least greater than an area of the first color signal storing device, and the conductive connecting member optically opaque;
   a plug connecting the conductive connecting member with the first color signal storing device, the plug extending through the substrate and at least partially beyond the substrate, a portion of the plug that extends beyond the substrate being wider than a portion of the plug that extends through the substrate; and
   a first color sensing photoelectric conversion device on the first color filter, the second color filter, and the conductive connecting member, the first color sensing photoelectric conversion device configured to convert incident light into the first light,
   wherein the conductive connecting member at least partially encloses the portion of the plug that extends beyond the substrate, and the conductive connecting member is in contact with the substrate at a first end and in contact with an electrode of the first color sensing photoelectric conversion device at an opposite, second end, and wherein the first light is green light, the second light is blue light, and the third light is red light.

2. The stacked image sensor of claim 1, wherein the first color sensing photoelectric conversion device comprises:
   a first electrode contacting the conductive connecting member;
   a semiconductor layer on the first electrode; and
   a second electrode on the semiconductor layer.

3. The stacked image sensor of claim 2, further comprising:
   an insulation layer between the first and second color filters and the first electrode of the first color sensing photoelectric conversion device.

4. The stacked image sensor of claim 3, wherein the insulation layer is made of at least one of silicon oxide (SiOx), silicon nitride (SiNx), aluminum oxide (AlOx), and germanium oxide (GeOx).

5. The stacked image sensor of claim 1, further comprising:
   a plurality of micro lenses on the first color sensing photoelectric conversion device.

6. The stacked image sensor of claim 5, wherein the conductive connecting member is configured to shade an entire region of the first color signal storing device when viewed from at least one of the plurality of micro lenses.

7. The stacked image sensor of claim 1, wherein the first photoelectric conversion device or the second photoelectric conversion device includes a complementary metal-oxide semiconductor (CMOS) device.

8. The stacked image sensor of claim 1, wherein the conductive connecting member is made of at least one of aluminum (Al), tungsten (W), chromium (Cr), molybdenum (Mo), copper (Cu), gold (Ag), and gadolinium (Gd).

* * * * *